United States Patent
Benzler et al.

(10) Patent No.: US 6,678,948 B1
(45) Date of Patent: Jan. 20, 2004

(54) METHOD FOR CONNECTING ELECTRONIC COMPONENTS TO A SUBSTRATE, AND A METHOD FOR CHECKING SUCH A CONNECTION

(75) Inventors: Jan Benzler, Sachsensheim (DE); Albert-Andreas Hoebel, Reutlingen (DE); Gerhard Schmidt, Lichtenau (DE); Stefan Rupprecht, Tomioka (JP); Thomas Ruzicka, Bietigheim-Bissingen (DE); Reiner Schuetz, Ditzingen (DE); Jiang Hongquan, Berlin (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/530,536

(22) PCT Filed: Aug. 27, 1999

(86) PCT No.: PCT/DE99/02670
§ 371 (c)(1),
(2), (4) Date: Dec. 11, 2000

(87) PCT Pub. No.: WO00/13228
PCT Pub. Date: Mar. 9, 2000

(30) Foreign Application Priority Data

Sep. 1, 1998 (DE) .................................. 198 39 760

(51) Int. Cl.[7] .......................... H05K 3/34; B23K 31/02
(52) U.S. Cl. .......................... 29/840; 29/843; 29/593; 228/103; 228/104
(58) Field of Search .................. 29/840, 841, 843, 29/593; 174/260, 262, 263, 266; 361/764, 743; 257/773, 778.19, 783, 787; 228/103, 104, 105; 378/58

(56) References Cited

U.S. PATENT DOCUMENTS

| | | | | |
|---|---|---|---|---|
| 4,029,963 A | * | 6/1977 | Alvarez | 250/360 |
| 4,852,131 A | * | 7/1989 | Armistead | 378/58 X |
| 4,940,633 A | * | 7/1990 | Hermansen et al. | 228/104 X |
| 5,184,768 A | * | 2/1993 | Hall | 228/104 |
| 5,246,880 A | | 9/1993 | Reele et al. | |
| 5,284,796 A | | 2/1994 | Nakanishi et al. | |
| 5,371,328 A | * | 12/1994 | Gutierrez | 174/261 |
| 5,489,750 A | | 2/1996 | Sakemi et al. | |
| 5,615,477 A | * | 4/1997 | Sweitzer | 29/840 |
| 5,636,104 A | * | 6/1997 | Oh | 361/777 |
| 5,938,452 A | * | 8/1999 | Wojnarowski | 439/67 |
| 6,009,145 A | * | 12/1999 | Zweig | 378/58 |
| 6,121,689 A | * | 9/2000 | Capote | 257/783 |

FOREIGN PATENT DOCUMENTS

| | | |
|---|---|---|
| EP | 0 697 727 | 2/1996 |
| GB | 2 215 912 | 9/1989 |
| JP | 60 038839 | 2/1985 |
| WO | WO 98/14995 | 4/1998 |

* cited by examiner

Primary Examiner—A. Dexter Tugbang
(74) Attorney, Agent, or Firm—Kenyon & Kenyon

(57) ABSTRACT

A method for connecting an electronic components to a carrier substrate is described. At least one pad of the component is connected electrically conductively to at least one pad on an upper surface of the carrier substrate. A solder bump is deposited on at least one of the pads to be connected, the component is alignedly mated with the carrier substrate, and the at least one solder bump is soldered in order to wet the contact surfaces.

It is provided that during the soldering, the at least one solder bump is deformed within the contacting plane in such a way as to achieve a degree of deformation that permits the two-dimensional analysis of said degree of deformation by a radiograph of the interconnection site.

14 Claims, 5 Drawing Sheets

METHOD FOR CONNECTING ELECTRONIC COMPONENTS TO A SUBSTRATE, AND A METHOD FOR CHECKING SUCH A CONNECTION

FIELD OF THE INVENTION

The present invention relates to a method for connecting electronic components to a carrier substrate an arrangement for connecting electronic components to a carrier substrate and a method for examining a connection between electronic components and a carrier substrate.

BACKGROUND INFORMATION

In is conventional to equip a carrier substrate with electronic components in a flip-chip process or ball grid array (BGA) process. In these methods, the electronic components are provided on their connection side with a plurality of solder "bumps" or "balls" and are then placed, connection side down, on a carrier substrate provided with contact surfaces mating is being effected in that the contact surfaces, or "pads," corresponding to solder bumps are alignedly assigned. The solder bumps used in the flip-chip process are usually about 75 to 80 $\mu$m in diameter and those used in the BGA process are usually about 500 to 700 $\mu$m in diameter. The carrier substrate is, for example, a ceramic substrate, a printed circuit board, a silicon substrate or the like. The solder bumps are then soldered to the pads of the carrier substrate in a reflow soldering process in which the solder bumps are melted in a reflow furnace and wet the contact surfaces of the carrier substrate.

Such a method is described, for example, in PCT application No. WO 98/14995, U.S. Pat. No. 5,284,796 and U.S. Pat. No. 5,246,880. During the flip-chip process, a plurality of electrically conductive connections that corresponds to the number of pads to be contacted are made simultaneously between the pads of the electronic component and the carrier substrate.

Because of the arrangement of the connecting contacts that are produced between the electronic component and the carrier substrate during reflow soldering, visual inspection is impossible. To be able to perform an inspection of the connecting contacts, in particular to check to make sure that the melted solder bumps have wet the contact,:surfaces of the pads on the carrier substrate, it is conventional to subject the bonding arrangement, consisting of the electronic component and the carrier substrate, to x-radiation and to analyze a prepared radiograph. Depending on the material used for the solder bumps, it is possible to achieve contrast visualization on the radiograph that show the solder bumps and the regions of the composite surrounding them. Depending on the resolution of the x-ray apparatus used, missing solder bumps or bridging between adjacent solder joints can readily be detected by this means. However, nonexistent or only partial wetting by the solder bumps of the contact surfaces of the pads on the carrier substrate, for example due to contamination of the pads, is not possible. These so-called "cold solder joints" hinder or prevent the operation of the electronic components, and it is therefore imperative that they be detected in a quality check.

SUMMARY OF THE INVENTION

The method according to the present invention offers the advantage that nondestructive examination of electrically conductive connections made by a flip-chip or BGA technique can be performed in a simple manner. Due to the fact that at least one solder bump is deformed in the bonding plane during soldering to achieve a degree of deformation that permits the analysis of said degree of deformation by a radiograph of the connection site, not only the presence of a solder joint, but also its proper wetting of the pad to be contacted can be checked via the intensity variation of the x-radiation passing through the bonding arrangement or by a two-dimensional or three-dimensional radiograph of the connection site.

In an advantageous embodiment of the present invention, particularly for use with the flip-chip technique, the solder bumps undergo a distribution of their material during the soldering, such that their thickness decreases continuously toward the margin, the distribution of material, for example is determined by a solder stop mask that encompasses the pads of the carrier substrate. It is thereby advantageously achieved that, the initial size,and thus the initial mass of the solder bumps being known, the solder bumps can undergo a defined deformation within the bonding plane. Depending on the arrangement of the solder stop mask, this results in a distribution of material that decreases toward the margins of the solder bumps, so that a defined deformation of the solder bumps takes place. On subsequent x-irradiation of the connection site, the x-rays are absorbed to different degrees by the material of the solder bump, according to the distribution of the material of the solder bumps that has occurred, thus giving rise to an intensity variation in which the x-rays passing through the bonding arrangement exhibit a continuous transition from a maximum intensity to a intensity and vice-versa. This, continuous transition between the minimum intensity and the maximum intensity provides a simple means of detecting wetting of the contact surface of the pad. Particularly if the diameters of masking openings in the solder stop mask are selected for a solder bump diameter within defined ranges, a defined distribution of the material of the solder bump can be achieved during the reflow soldering of the components on the carrier substrate. This therefore produces the continuous variation of the thickness of the solder bump viewed in the bonding plane, and thus the continuous transition between a minimum and a maximum intensity of the x-rays passing through the bonding arrangement.

The method according to the present invention for examining a connection between electronic components and a carrier substrate further permits, in a simple manner and with high precision, the quality assessment of contact points obtained by a flip-chip process or the BGA technique. Because an influence on an intensity variation of x-rays passing through the bonding arrangement is analyzed in a region of transition from a soldered solder bump to the region surrounding it or on a two-dimensional,or three-dimensional radiograph of the connection site, the solder bumps being deformed during soldering in such a way that when the pads are properly wetted it is possible to measure a continuous transition in the intensity variation or a visible deformation of the solder bump on the radiograph, defect-free or defective contact points can be recognized from the radiographs obtained.

Due to their deformation during soldering, the solder bumps undergo a distribution of their material in which the volume (thickness) decreases toward their margins, causing a continuous transition in the intensity of the measured x-rays. Since x-radiation that is applied uniformly within the bonding plane to the bonding arrangement obtained is absorbed or transmitted differently, according to the distribution of the material of the solder bumps. This is what produces the intensity variation on the radiograph. If the solder bumps are not properly wetted by the pads, the intended distribution of the material of the solder bumps does not take place, and there is, therefore, no measurable corresponding continuous transition of the intensity distribution of the x-rays. Such unwetted or insufficiently wetted solder bumps are distinguished by an abrupt transition of the intensity, distribution. It can therefore be concluded from the abrupt variation in intensity that a "cold solder joint" is present. A nondestructive and precise analysis can be performed in this manner, particularly in the case of the relatively small solder bumps used in the flip-chip technique.

The unequivocal deformation of the kind that can be obtained in particular with the relatively large solder bumps used in BGA techniques can be rendered visible, and therefore made susceptible to analysis on a two-dimensional or three-dimensional radiograph. Due to the relatively large volume of the solder bumps, a continuous transition of the intensity variation cannot be detected in this case. Here, the deformation—with an abrupt transition in intensity between the solder bumps and the region surrounding them, evincing flawless wetting of the pad—is clearly recognizable on the radiograph.

In a further advantageous embodiment of the present invention, the pad of the carrier substrate is encompassed by a solder stop mask the opening of which is larger than the pad. This advantageously makes it possible for deformation of the solder bump to take place during the soldering of the bonding arrangement so that edge faces of the pad that extend substantially perpendicularly to the bonding plane of the bonding arrangement can be co-wetted by the material of the solder bump. Because the solder stop mask is spaced away from the pad, this gap can be utilized to permit deformation of the material of the solder bump within the gap, the edges of the pad simultaneously being wetted when proper wetting occurs.

The proper wetting of the edges of the pad can be checked by an advantageous method for examining the connection between the electronic component and the carrier substrate. By the preparation and analysis of a three-dimensional radiograph of the bonding arrangement in the region of a layer that lies in a plane with the at least one pad of the carrier substrate, proper wetting of the edges can be demonstrated in a simple manner on the radiograph of the layer. Because only the layer in which the pads are disposed is picked out from the bonding arrangement as a whole and visualized, the presence of material deformed into the plane of the pad during the soldering, so that said material can wet the edges, can be identified by a ring-shaped pattern on the radiograph.

Moreover, in an advantageous embodiment of the present invention, wetting of the edges of the pad can be checked by a two-dimensional radiograph of the bonding arrangement. In a two-dimensional radiograph, wetting of the edges can be detected very advantageously in that the intensity variation of the x-ray beams passing through the bonding arrangement exhibits a characteristic saddle shape, which, in a simple manner, furnishes evidence of proper wetting of the edges.

Also, an advantageous embodiment of the present invention, the deformation of the—essentially round—solder bump can be accomplished by defined shaping of the pads. During the soldering, the solder bump wets thee shaped pad and thereby essentially assumes its shape. Defined shapes for the pad are, for example, oval, triangular polygonal shapes or the like.

Wetting conforming to the shape of the pad produces a set deformation of the solder bump that can be detected on a two-dimensional radiograph. If the shape of the solder bump matches the known shape of the pad, it can be assumed that complete and therefore proper wetting of the pad has taken place. If the shape of the solder bump on the radiograph matches, for example, the original shape of the solder bump, particularly a round shape, it can be inferred from this failure of the solder bump to assume the shape of the pad that improper wetting of the pad has taken place.

DETAILED DESCRIPTION

Figure 1:
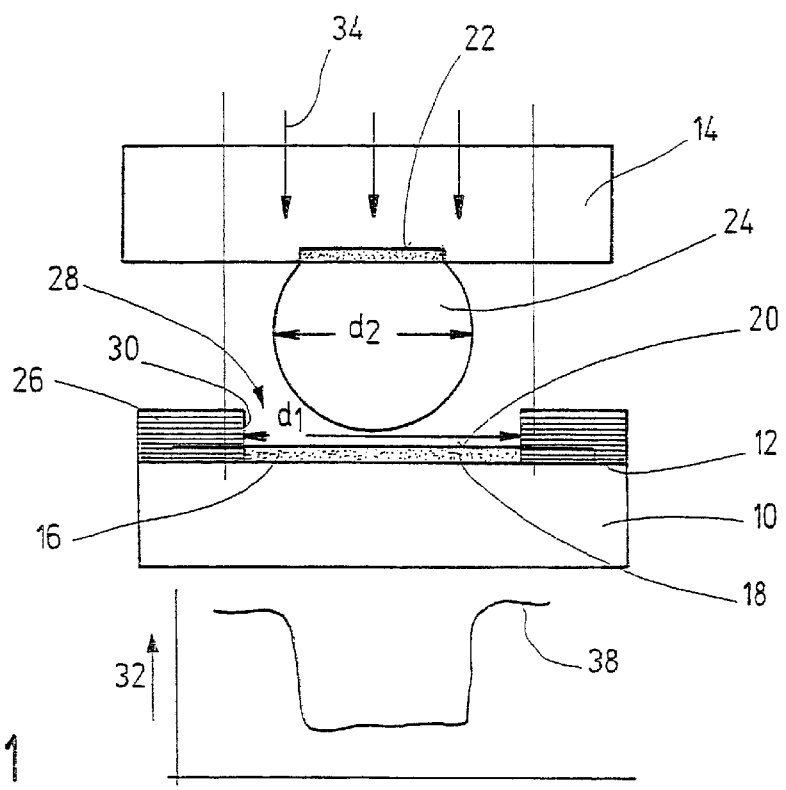
FIG. 1 shows a detail of a cross section through a carrier substrate with a flip-chip component placed thereon before reflow soldering.

FIG. 1 shows a detail of a cross section through a carrier substrate 10, which may be for example, a printed circuit board, a ceramic plate, a silicon substrate or the like. In the example shown here, the substrate is a printed circuit board, the upper surface 12 of which is to be equipped with electrical and/or electronic components 14. Deposited on the upper surface 12 are printed circuit traces 16. Only one such printed circuit trace 16 is shown in FIG. 1 and the subsequent figures, although the carrier substrate 10 can obviously comprise a plurality of printed circuit traces 16. Printed circuit trace 16 terminates in a pad 18 that forms a contact surface 20, which is used to establish an electrical connection to the components 14.

The printed circuit trace 16 is provided to equip carrier substrate 10 with flip-chip components and/or SMD (surface-mounted device) components, only a detail of component 14 being shown. A comparable connecting technique is to produce solder connections by ball grid arrays. The term "solder bumps" is used interchangeably hereinbelow to signify bumps, balls or the like.

At the mounting location of component 14, the upper surface 12 of the carrier substrate is provided with a pattern of pads 18 that correspond to a pattern of pads 22 of component 14. Each pad 22 of the component 14 that is to be contacted is therefore assigned a pad 18 of the carrier substrate 10, i.e., the contacts are disposed opposite one another on the confronting surfaces of component 14 and carrier substrate 10 before component 14 and carrier substrate 10 are interconnected.

Each pad 22 of component 14 possesses a solder bump (or ball) 24 that is made of, or at least contains, an electrically conductive material. The solder bumps 24 are deposited on the pads 22 by conventional methods, so this subject will not be treated in further detail in this description. In the flip chip technique the solder bumps have a diameter $d_2$ of about 75 to e 80 $\mu$m, and in the BGA technique a diameter of about 500 to 700 $\mu$m.

The pads 18 of substrate 10 are surrounded by a solder stop mask 26. Solders stop mask 26 has masking openings that correspond to the grid of the electrically conductive connections to be made between component 14 and carrier substrate 10 and that are bounded by the side walls 30 of solder stop mask 26. Solder stop mask 26 is formed, for example, by a solder stop resist applied by screen printing.

The openings 28 are, for example, round and have a diameter $d_1$ that is selected to be larger than a diameter $d_2$ of the substantially spherical solder bumps 24. The ratio of the diameters $d_2:d_1$ is, for example, greater than 1:1.1, particularly 1:1.3 to 1:1.4.

Figure 2:
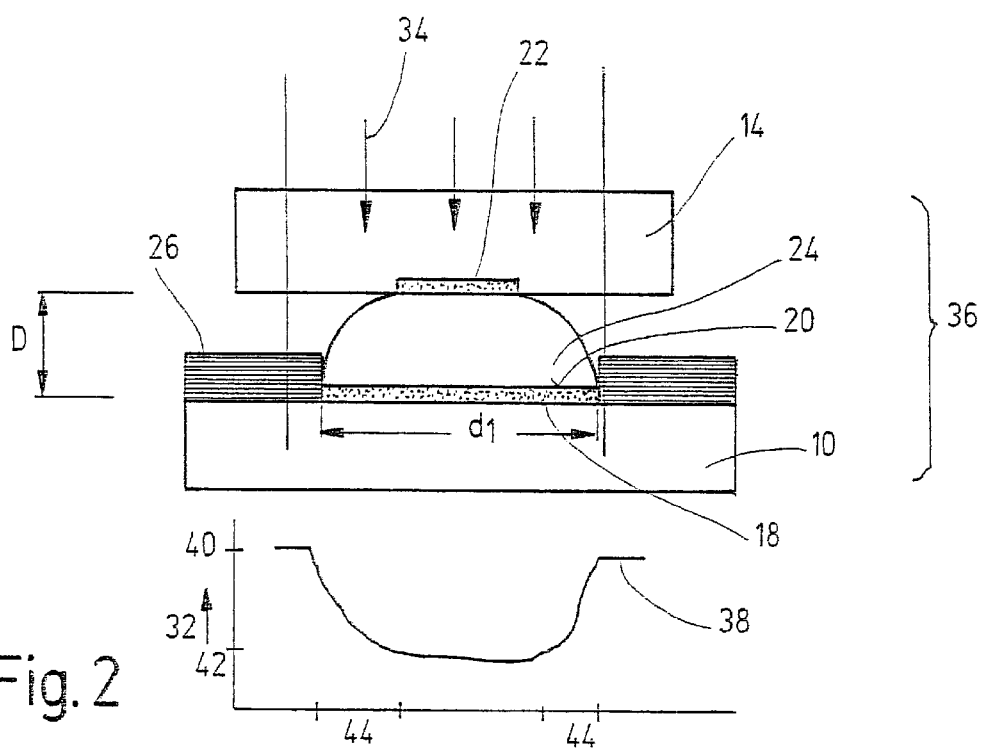
FIG. 2 shows a first embodiment of a bonding arrangement after reflow soldering.

A diagram below each of the schematic partial sectional views in FIGS. 1 to 4 charts the intensity variation 32, over their spatial distribution, of the x-rays 34 passing through the arrangement. This represents the intensity variation 32 that occurs during passage through.<the,bonding plane of a bonding arrangement 36 (FIG. 2). The bonding plane is coincident with a plane parallel to the upper surface 12 of carrier substrate 10. In FIG. 1, this intensity variation 32 is shown merely for purposes of explanation, it being clear that on reaching the bonding arrangement 36, the x-radiation penetrate it with varying intensity due to the given composition of the material in the individual regions of the bonding arrangement 36. Particularly in the region of the solder bumps 24, the x-radiation 34 undergoes strong absorption, so that in the characteristic 38 reflecting the intensity variation 32, diameter $d_2$ of solder bump 24 is clearly apparent in characteristic 38 in the form of an abrupt change in intensity 32.

FIG. 2 shows the bonding arrangement 36 after reflow soldering. For this purpose, component 14 is placed on carrier substrate 10, the solder bumps 24 thus being placed on the contact surfaces 20. It is understood that all the solder bumps 24 of component 10 have the same dimensions, permitting the uniform placement of all said solder bumps 24 on the contact surfaces 20 respectively assigned to them. The bonding arrangement 36 is then conveyed to a reflow soldering station. At the reflow soldering station, the solder of solder bumps 24 is heated and melted. As a result, the material of the solder bumps 24 begins to flow and wets the contact surface 20. According to the size of the openings 28 in solder stop mask 26, the material of solder bumps 24 flows to the side walls 30, so that contact surface 20 is completely wetted. The pads 18 are made of a readily wettable material, for example nickel, copper or gold. Due to the good wettability of contact surfaces 20, the solder assumes the shape depicted in FIG. 2. The surface tension of the solder and the weight of component 14 cause component 14 to be moved toward upper surface 12 of carrier substrate 10 until, for example, this approaching movement is halted by spacers (not shown in the figures).

As the space between component 14 and carrier substrate 10 diminishes, the mass of the solder bumps 24 comes to be redistributed over its thickness D. Based on the ratio of the diameters $d_2$ to $d_1$ (FIG. 1), there is a continuous transition of the thickness D of solder bump 24 from its margin, which is defined by the side wall 30 of the masking opening 28, to its center in the region of the pads 22 of component 14. A deformation of the solder bump 24 within the bonding plane therefore takes place, the degree of deformation and thus the distribution of the material of solder bump 24 across the bonding plane being definable by the ratio of the diameters $d_2$ to $d_1$.

It thus becomes possible to use x-radiation to check the connection between component 14 and carrier substrate 10 for proper wetting of solder bump 24 on contact surface 20. In accordance with the intensity variation 32 (again depicted) across the bonding plane, a continuous transition between a maximum 40 and a minimum 42 of the intensity 32 of the x-radiation 34 can be observed on the basis of characteristic 38. This continuous transition—denoted as 44 in FIG. 2—corresponds in this case to the decrease in the thickness D of solder bump 24 in its surface-adhesion extent within the bonding plane. It can therefore be determined in a simple manner, by nondestructive examination of the finished bonding arrangement 36 by x-rays 34, whether all the solder bumps 24 are wetting the contact surface 20. If such wetting does not take place, there are abrupt transitions in the intensity variation 32 of the x-rays 34, as shown in FIG. 1. If no such abrupt transitions are present, i.e., if characteristic 38 includes a continuous transitional region 44 for each solder bump 24, it can be assumed that flawless electrical contact has been established between component 14 and carrier substrate 10.

According to the number of components 24 to be examined, seen in plan view—i.e., as depicted in FIGS. 1 and 2, viewed from above—the prepared radiograph will show a flat intensity distribution of the x-rays 34 for each of the solder bumps 24. Since the solder bumps 24 are realized as substantially spherical, the intensity distribution for each solder bump 24 is radial in shape, the regions 44 between corresponding radii running about a central point of the solder bump 24 that is characterized by the minimum 42 of the intensity 32.

An inspection of the bonding arrangement 36 can optionally be performed by comparing a radiograph of the not-yet-soldered connection according to FIG. 1 with a radiograph of the soldered connection according to FIG. 2, using as the evaluative criterion the difference between the discontinuities between minima and maxima in the intensity variation 32 and the then continuous transitional regions 44 between the minima 42 and the maxima 40. The analysis of the radiographs can be performed either manually or automatically in a suitable manner, by image processing.

Figure 3:
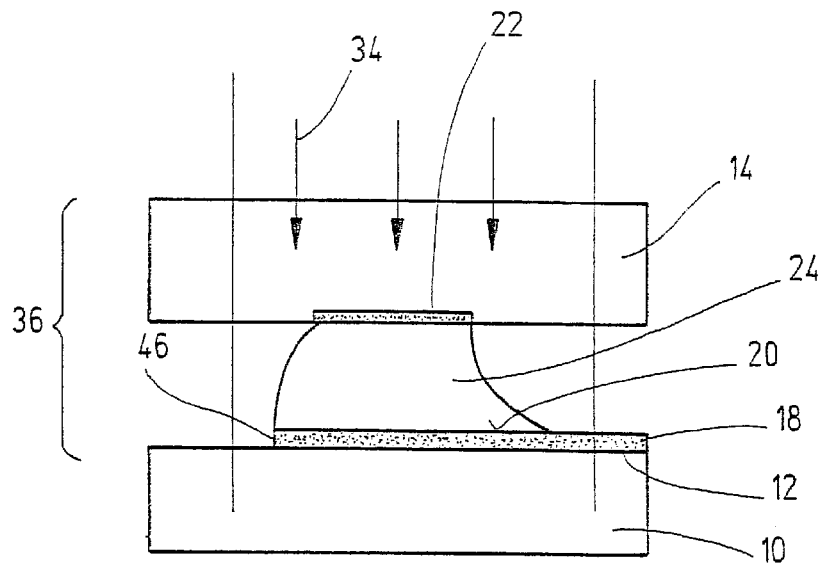
FIG. 3 shows a second embodiment of a bonding arrangement after reflow soldering.
Figure 3:
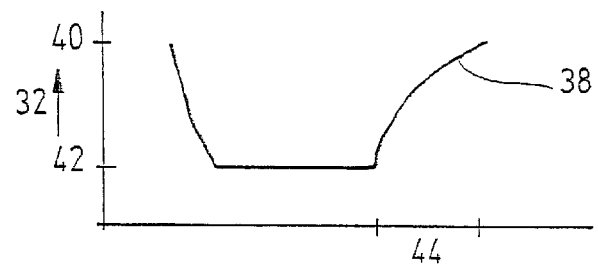

FIG. 3 shows a further embodiment of an already-soldered bonding arrangement 36. No solder stop mask has been used in this case, and the solder from solder bump 24 is therefore able to flow across contact surface 20 or the surface of printed circuit trace 18 having contact surface 20. Due to the good wettability of contact surface 20, the solder flows only in the direction of printed circuit trace 18, so that there is no flow of solder at the terminus 46 of printed circuit trace 18, shown on the left here. According to further exemplary embodiments, the contact point 18 can also be realized so that an even flow of solder can occur in all directions of the bonding plane.

In accordance with the again-depicted examination of the connection on the basis of the intensity variation 32 of the x-rays 34, it is clear that there is a continuous transition between the minimum 42 and the maximum 40 of the intensity 32 of the x-rays 34 in the region of flow of the solder. If this continuous transitional region 44 is not found on analysis, but instead there is an abrupt transition between the minimum 42 and the maximum 40, it can be concluded that the solder has not wetted the contact surface 20 to the desired extent.

Figure 4:
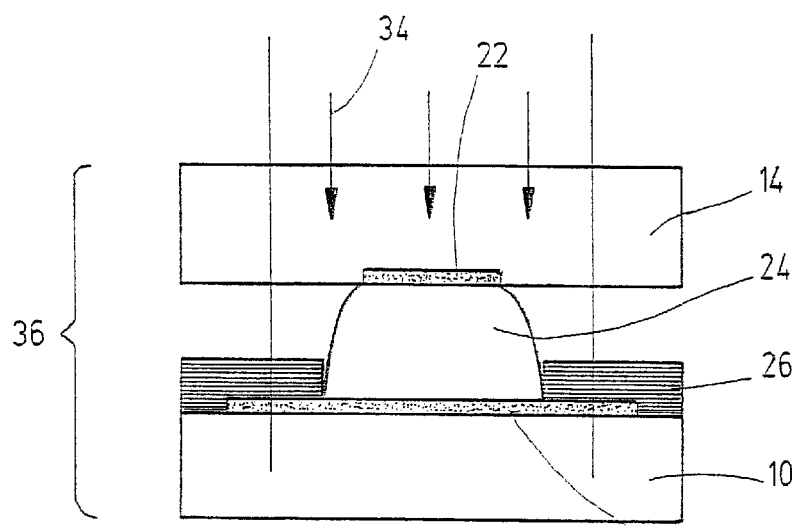
FIG. 4 shows a bonding arrangement according to the prior art after reflow soldering.
Figure 4:
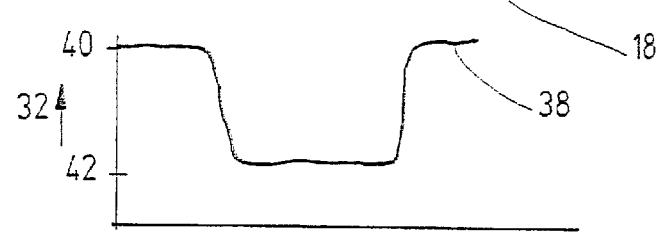

A bonding arrangement 36 according to the prior art is shown in FIG. 4. Here, the ratio between a diameter $d_1$ of opening 28 in solder stop mask 26 and the diameter $d_2$ of solder bump 24 is almost unity, i.e., the ratio of the diameters $d_1:d_2$ is 1:1, and thus there is essentially no deformation of the solder bumps 24 in the direction of the bonding plane, so that a two-dimensional x-ray examination performed here leads to an abrupt transition between the minimum 42 and the maximum 40 of the intensity variation 32 of the x-rays 34. Thus, although the presence of an electrically conductive connection across a solder bump 24 can be detected, it is not clear whether adequate wetting of the contact surface 20 has actually taken place.

Figure 5:
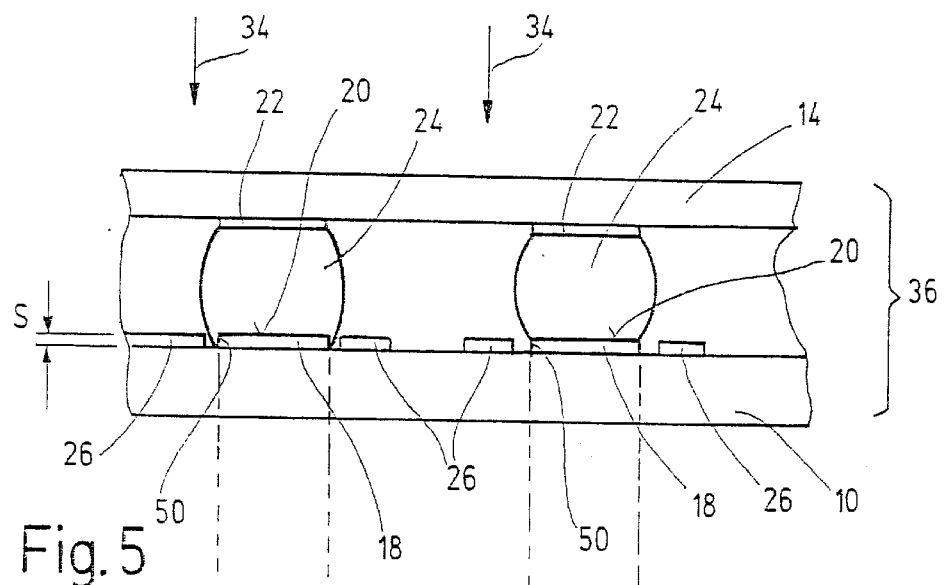
FIG. 5 shows a cross-sectional schematic view of a third embodiment of a bonding arrangement after reflow soldering.

FIG. 5 shows a further bonding arrangement 36 in another exemplary embodiment. The same parts as in the previous figures have been provided with the same reference numerals and will not be described again.

FIG. 5 depicts two solder bumps 24, of which, the one shown on the left wetted the pad properly after component 14 was soldered to carrier substrate 10, whereas the solder bump shown on the right by comparison did not properly wet pad 18. The deformation of solder bump 24 that occurs according to the present invention during soldering is accomplished in that a solder stop mask 26 is spaced with respect to the pad 18 in such a way that side edge faces 50 of pad 18, i.e., edge faces 50 that extend essentially perpendicularly to the bonding plane, are co-wetted by solder bump 24. The wetting of edge faces 50 of pad 18 is readily possible because, inter alia, the material of the solder bump 24 is converted to the molten state during soldering, so that—due to the good wettability of the material of pad 18, which is made, for example, of gold, aluminum, platinum or the like—the edge faces 50 are co-wetted when a residual space between solder stop mask 26 and pad 18 becomes filled with solder. This spacing between solder stop mask 26 and pad 18 enables solder bump 24 to undergo during soldering a set deformation that can be analyzed by an x-ray method, as explained further hereinbelow.

By comparison, solder bump 24 shown on the right has not properly wetted pad 18. The space between solder stop mask 26 and pad 18 is not filled with the material of solder bump 24, and thus the edge faces 50 of pad 18 are not wetted. This can occur, for example, due to contamination of pad 18 that detracts from its intrinsically good wettability.

Figure 6:
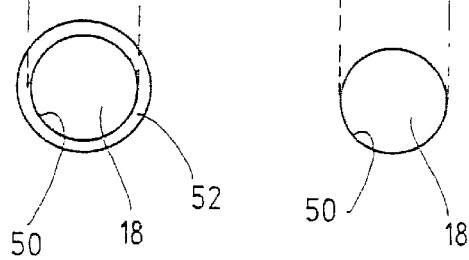
FIG. 6 shows a schematic view of a three-dimensional radiograph of the bonding arrangement shown in FIG. 5.

In order to check for the proper wetting of pad 18 by solder bumps 24, the layer of bonding arrangement 36 denoted by S in FIG. 5 is examined by a three-dimensional x-ray technique and is visualized in a radiograph schematically indicated in FIG. 6. Layer resolutions of about 30 to 100 μm can be achieved with the available 3D x-ray technology. The pads 18, which are deposited on the carrier substrate 18, for example, by screen printing or another suitable method, usually have a layer thickness of about 50 μm. Thus, 3D x-ray technology can be used to extract the layer S containing pads 18 from bonding arrangement 36. Visualization of this layer S in the radiograph results in the image indicated schematically in FIG. 6. In this case, in which pad 18 has been properly wetted, the material of solder bump 24 that is within layer S is visible as a ring 52 surrounding pad 18. In the image indicated schematically in FIG. 6, however, because the edges 50 of pad 18 have not been wetted, none of the material of solder bump 24 in layer S is deformed, and thus no such material can be seen on the radiograph. Again, on analysis of the radiographs, if a ring 52 is present around pad 18, it can be assumed that proper wetting of the pads 18 has taken place.

Figure 7:
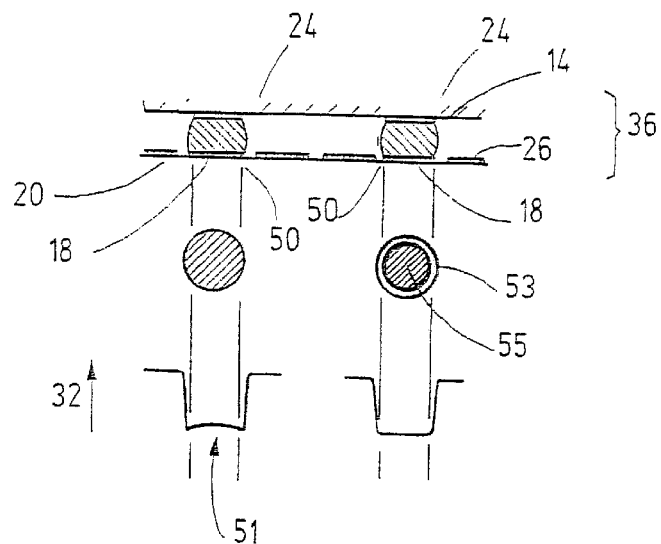
FIG. 7 shows a schematic view of a two-dimensional radiograph.

FIG. 7 illustrates a two-dimensional x-ray analysis of the bonding arrangement 36. The depiction of bonding arrangement 36 in FIG. 7 corresponds to the bonding arrangement 36 shown in FIG. 5. Corresponding to the wetting of the edges 50 of pads 18, a distribution of the material of solder bumps 24 occurs that can be illustrated in a two-dimensional visualization. In the left-hand diagram of FIG. 7 proper wetting of the edges 50 has occurred, resulting in a distribution of the solder material from solder bumps 24 that corresponds to the intensity curve 32 shown, a saddle shape being produced in this case. If proper wetting of the edges 50 does not occur—as in the right-hand diagram of FIG. 7—the distribution of the material of solder bump 24 is such that much less solder is present in its marginal areas 53 than at the center 55. This results in the x-ray intensity curve 32 shown at the bottom, in which this saddle shape does not appear. Observation of a saddle shape 51 in the intensity curve 32 is therefore a criterion for proper wetting of the pad 18.

Figure 8:
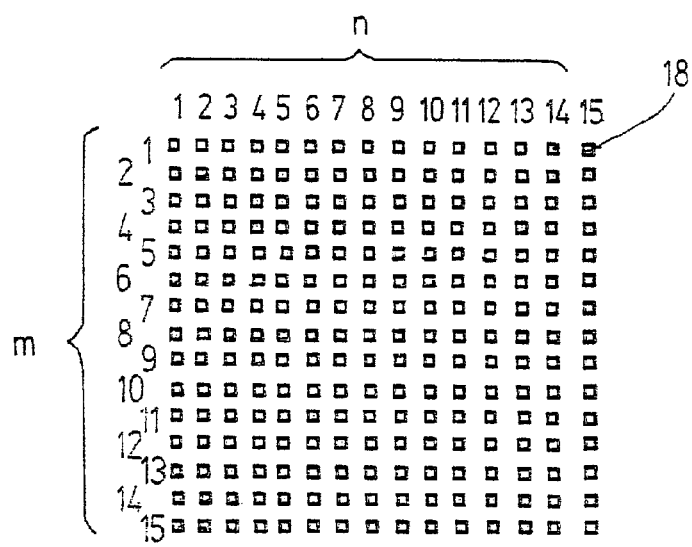
FIG. 8 shows a plan view of a connection diagram of a printed circuit board.

FIG. 8 is the connection diagram of a printed circuit board with n x m pads 18. n and m can be equal to 15, for example. To bring about a set deformation of the solder bumps during soldering as a result of the wetting of pads 18, pads 18 can have a defined shape viewed in plan.

Figure 9:
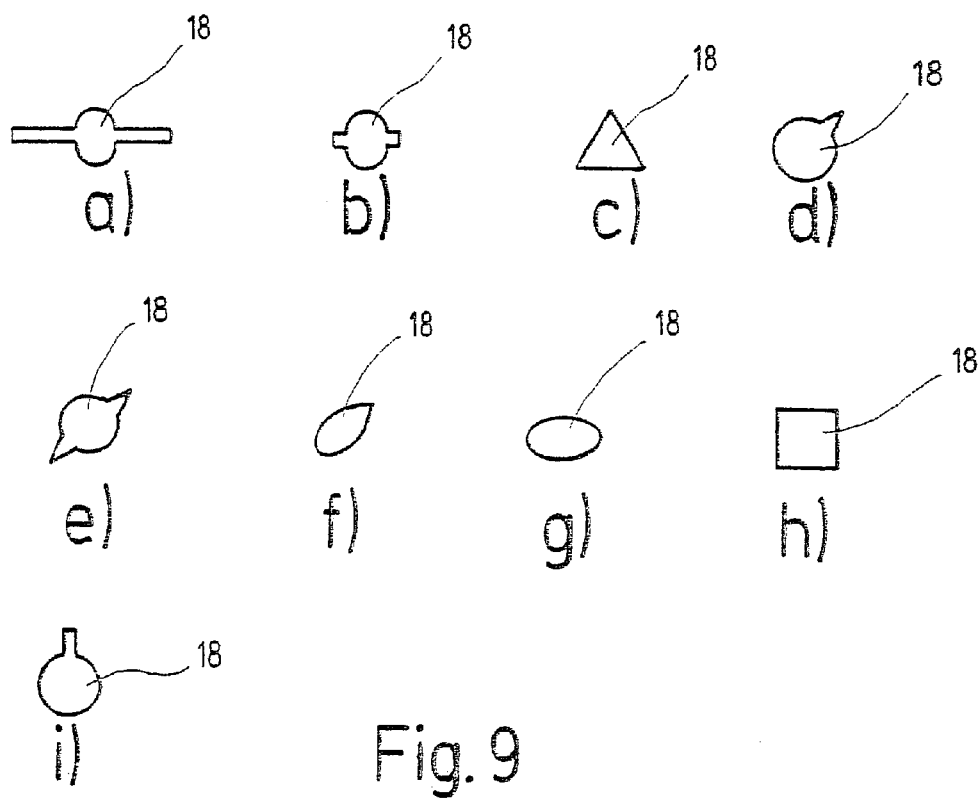
FIG. 9a shows a first embodiment of a circular shaped pad with projecting lands.
FIG. 9b shows a second embodiment of a circular shaped pad with projecting lands.
FIG. 9c shows a triangular shaped pad.
FIG. 9d shows a circular shaped pad with a triangular nose.
FIG. 9e shows a circular shaped pad with two triangular noses.
FIG. 9f shows a tear-drop shaped pad.
FIG. 9g shows an oval shaped pad.
FIG. 9h shows a square shaped pad.
FIG. 9i shows a circular shaped pad with a land.

FIGS. 9g–i are a plan view of various pads 18 depicted on a greatly enlarged scale in order to illustrate some of the possible defined shapes for the pads 18. The defined shaping of the pads can, for example, be effected by the realization of a solder stop mask on a printed circuit trace , in which case a mask opening of the solder stop mask then produces the shape of the pad 18. A further possibility is to deposit the pads 18 themselves on the carrier substrate 10 in the appropriate shape. It is crucial that the geometry of the pads 18 deviate from a circular shape that substantially matches the round shape of the solder bumps, so that upon the wetting of the pads 18 the solder bumps flow according to the geometry of the pads 18 and assume their shape. This results in an intended deformation of the solder bumps 24. As is apparent from the selection of possibilities shown, the pad 18 can, for example, comprise lands projecting from a round shape, as in FIGS. 9a and 9b; it can be triangular, as in FIG. 9c; it can comprise a nose arising from a circular shape, as in FIG. 9d, and oppositely disposed noses arising from a circular shape, as in FIG. 9e; it can be teardrop-shaped, as in FIG. 9f; oval, as in FIG. 9g; square, as in FIG. 9h; and round with one land, as in FIG. 9i. In these cases, all the pads 18 to be contacted can have the same geometrical shape or mixed shapes, that is, pads 18 of one printed circuit board can have different geometrical shapes. It is advantageous, however, if all the pads on one printed circuit board that are to be contacted have the same geometrical shape.

Figure 10:
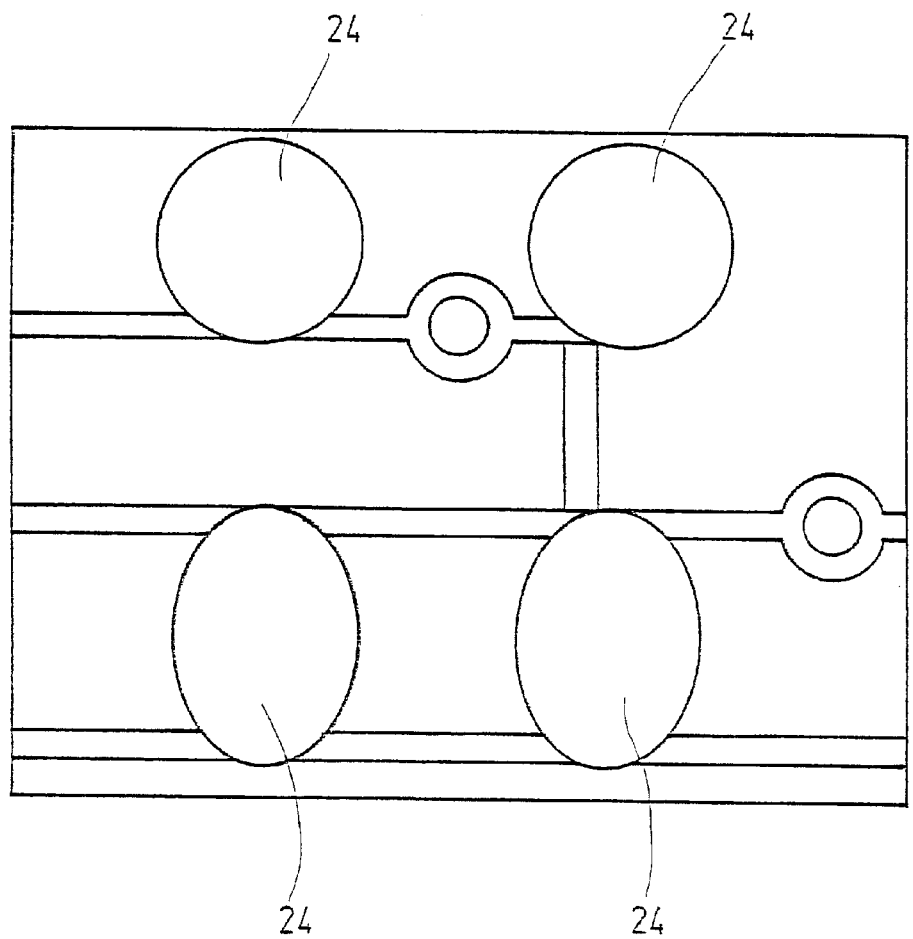
FIG. 10 shows a schematic two-dimensional radiograph of a bonding arrangement.

FIG. 10 is a schematic detail of a two-dimensional radiograph that can be used to check for the proper wetting of pads 18 by solder bumps 24. Here, for example, four solder bumps 24 can be recognized (the film reproduces further printed circuit trace s and through platings that will not be discussed here), of which the two solder bumps 24 shown at the top have a substantially circular shape, whereas the two solder bumps 24 shown at the bottom have a substantially oval shape. It is clear from this film that based on their oval shape, the solder bumps 24 have properly wetted the pads 18, which previously had precisely this oval shape. The solder bumps 24 shown at the top in FIG. 10 have retained their original shape as essentially round unsoldered solder bumps 24 and have not properly wetted the pads 18, which are also oval here; a defective, cold solder joint can therefore be assumed. These two-dimensional radiographs, which are relatively easy to prepare for the comparison, can therefore be used to perform a nondestructive, unambiguous and reliable check for proper bonding, subject to advance preparation of the pads 18 by the appropriate shaping thereof (examples shown in FIGS. 9a to 9i).

What is claimed is:

1. A method for connecting at least one electronic component to a carrier substrate, comprising the steps of:
   electrically conductively connecting at least one pad of the at least one electronic component to at least one pad of the carrier substrate;
   depositing a solder bump on one of the at least one pad of the at least one electronic component and the at least one pad of the carrier substrate;
   alignedly mating the at least one electronic component with the carrier substrate;
   soldering the solder bump to wet contact surfaces of the at least one electronic component and the carrier substrate;
   deforming the solder bump within a contacting plane during soldering so that a degree of deformation is achieved that permits an analysis of the degree of deformation by a radiograph of the contact surfaces; and
   evaluating a continuous intensity distribution of the radiograph along a line.

2. The method according to claim 1, wherein:
   during the step of soldering the solder bump is distributed so that a thickness of a soldering material decreases continuously toward a margin.

3. The method according to claim 1, further comprising the step of:
   determining the degree of deformation of the solder bump by a solder stop mask, the solder stop mask encompassing the at least one pad of the carrier substrate, the solder bump being fitted into the at least one pad of the carrier substrate.

4. The method according to claim 1, further comprising the step of:
   determining the degree of deformation of the solder bump by a size ratio of a first diameter of masking openings in a solder stop mask to a second diameter of the solder bump.

5. The method according to claim 1, further comprising the step of:
   intentionally regionally wetting printed circuit traces to cause the deformation of the solder bump, the printed circuit traces including the at least one pad of the carrier substrate.

6. The method according to claim 1, further comprising the step of:
   intentionally wetting edge surfaces of the at least one pad of the carrier substrate to cause the deformation of the solder bump.

7. The method according to claim 1, wherein:
   the deformation of the solder bump is effected by a deliberate wetting of the at least one pad of the carrier substrate, the at least one pad of the carrier substrate deviating from a circular shape.

8. The method according to claim 1, further comprising the step of:
   using a flip-chip technique to form the connection between the at least one pad of the at least one electronic component and the at least one pad of the carrier substrate.

9. The method according to claim 1, further comprising the step of:
   using a ball grid array technique to form the connection between the at least one pad of the at least one electronic component and the carrier substrate.

10. The method according to claim 1, wherein the evaluating step includes the substep of identifying abrupt transitions.

11. The method according to claim 1, wherein the evaluating step includes the substep of determining wetting of vertical sidewalls of the at least one pad.

12. A method for examining a connection between an electronic component and a carrier substrate, pads of the electronic component being connected to assigned pads of the carrier substrate via at least one solder bump, comprising the steps of:
    after connection of the electronic component to the carrier substrate, exposing a bonding arrangement to x-rays directed perpendicularly to a contacting plane;
    making a radiograph on a side of the bonding arrangement facing away from an x-ray source; and
    analyzing an intensity variation of the x-rays in a transitional region from a solder bump to a region surrounding the solder bump, the solder bump being deformed during soldering so that one of a continuous transition of the intensity variation from a minimum intensity to a maximum intensity and a set deformation of the solder bump is measurable when proper wetting of the assigned pads has taken place.

13. The method according to claim 12, further comprising the step of:
    preparing and analyzing a two-dimensional radiograph of the bonding arrangement.

14. The method according to claim 12, further comprising the step of:
    preparing and analyzing a three-dimensional radiograph of the bonding arrangement in a region of a layer, the layer lying in a plane with at least one pad of the carrier substrate.

* * * * *

UNITED STATES PATENT AND TRADEMARK OFFICE
CERTIFICATE OF CORRECTION

PATENT NO. : 6,678,948 B1
DATED : January 20, 2004
INVENTOR(S) : Benzler et al.

It is certified that error appears in the above-identified patent and that said Letters Patent is hereby corrected as shown below:

Column 1,
Line 45, change "contact,:surfaces" to -- contact surfaces --

Column 2,
Line 18, change "size,and" to -- size, and --

Column 5,
Line 39, change "through.<the,bonding" to -- through the bonding --

Column 8,
Line 40, change "FIGS.$9_{g\text{-}i}$" to -- FIGS. $9_{a\text{-}i}$ --

Signed and Sealed this

Twelfth Day of October, 2004

JON W. DUDAS
*Director of the United States Patent and Trademark Office*